United States Patent
Roohparvar

(10) Patent No.: US 7,461,306 B2
(45) Date of Patent: *Dec. 2, 2008

(54) OUTPUT DATA COMPRESSION SCHEME USING TRI-STATE

(75) Inventor: Frankie Fariborz Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 283 days.

This patent is subject to a terminal disclaimer.

(21) Appl. No.: 11/409,729

(22) Filed: Apr. 24, 2006

(65) Prior Publication Data

US 2006/0242494 A1    Oct. 26, 2006

Related U.S. Application Data

(63) Continuation of application No. 10/229,702, filed on Aug. 28, 2002, now Pat. No. 7,055,076.

(51) Int. Cl.
*G11C 29/00* (2006.01)
*H03M 13/00* (2006.01)

(52) U.S. Cl. .................... 714/718; 714/820

(58) Field of Classification Search .............. None
See application file for complete search history.

(56) References Cited

U.S. PATENT DOCUMENTS

| | | | |
|---|---|---|---|
| 5,511,029 A | 4/1996 | Sawada et al. | |
| 5,587,950 A | 12/1996 | Sawada et al. | |
| 5,787,097 A | 7/1998 | Roohparvar et al. | |
| 5,946,245 A | 8/1999 | Brown et al. | |
| 5,966,388 A | 10/1999 | Wright et al. | |
| 6,163,863 A | 12/2000 | Schicht | |
| 6,356,487 B1 | 3/2002 | Merritt | |
| 6,557,129 B1 | 4/2003 | Rajski | |
| 6,591,384 B1 * | 7/2003 | Chou ........................... | 714/718 |

* cited by examiner

*Primary Examiner*—Christine T Tu
(74) *Attorney, Agent, or Firm*—Leffert Jay & Polglaze, P.A.

(57) ABSTRACT

A memory device uses data compression to read data from an array of the memory during testing. The compressed data is either a logic one, logic zero or tri-state, depending upon the data read from the array. Output drivers of the memory are placed in a tri-state condition in response to a detected read error. Non-compressed internal I/O lines are used during testing to provide control signals to the driver circuitry to selectively place drivers in the tri-state mode. Once a tri-state is detected four columns of memory cells can be replaced with four columns of redundant memory cells without requiring additional non-compressed testing.

19 Claims, 3 Drawing Sheets

US 7,461,306 B2

OUTPUT DATA COMPRESSION SCHEME USING TRI-STATE

RELATED APPLICATIONS

This application is a continuation of U.S. patent application Ser. No. 10/229,702, filed Aug. 28, 2002 (allowed) now U.S. Pat. No. 7,055,076, and titled, "OUTPUT DATA COMPRESSION SCHEME USING TRI-STATE".

FIELD OF THE INVENTION

The present invention relates generally to integrated circuit devices and in particular the present invention relates to testing of memory devices.

BACKGROUND OF THE INVENTION

Integrated circuit memory devices typically include one or more arrays of memory cells that store data. The data is either read from or written to the memory cell using data communication connections. Some example memory devices include but are not limited to random access memories (RAM), dynamic random access memories (DRAM), Synchronous DRAM (SDRAM), static RAM (SRAM), and non-volatile memories such as FLASH.

During production of the memory devices, the individual memory cells need to be tested. Thus, data is written to the memory cells and then the data is read from the memory. As the density of the memory arrays increase, the time and cost needed to fully test the memory array also increases. For example, a common testing procedure for a memory connected to a memory tester is to first have the tester send a command to the memory to erase all of its bits to "1". The tester then reads the memory cells to verify that they are all "1". Next, zeros are written to all of the bits of the memory and the cells are read in order to verify that they are all "0". Then, all of the bits of the memory are erased, a checkerboard pattern is written to the memory and the cells are read in order to verify that the checkerboard pattern is present. Finally, all of the bits of the memory are erased, an inverted checkerboard pattern is written to the memory, and the cells are read in order to verify that the inverted checkerboard pattern is present. This testing procedure is a good way to find out if any of the bits of the memory are shorted to an adjacent bit, to a high level, or to a low state, or if there are any other problems.

Because the cost of testing has becoming a significant component of the total manufacturing cost of memory chips, testing using compressed data lines can be implemented. See U.S. Pat. No. 5,787,097 entitled "Output Data Compression Scheme for Use in Testing IC Memories," issued Jul. 28, 1998. This patent describes a system for compressing data during a test operation so that multiple memory devices can be simultaneously tested using a common tester. Thus, less data communication connections (DQ's) are required for a given number of memory cells when implementing data compression.

One deficiency of read compression is the identification of a defective location. That is, if an error is detected during testing a full non-compressed read operation may be needed to identify the defect location for redundant repair. A non-compressed test operation requires all of the DQ's, and is counter productive to the compressed testing scheme.

For the reasons stated above, and for other reasons stated below which will become apparent to those skilled in the art upon reading and understanding the present specification, there is a need in the art for a memory device with improved test operations.

SUMMARY OF THE INVENTION

The above-mentioned problems with testing memory devices and other problems are addressed by the present invention and will be understood by reading and studying the following specification.

In one embodiment, a memory device operable in a normal mode of operation and a test mode of operation comprises sensing circuitry which reads X number of data bits during a test mode read cycle, read compression circuitry to generate Y compressed data bits, wherein Y is less than X, in response to the X data bits, and an output circuit coupled to the read compression circuitry to drive Y output signals. The Y output signals are either a logic one, a logic zero or tri-state.

In another embodiment, a flash memory device comprises compression circuitry to compress X data bits read from X columns of the flash memory into Y data bits, an output driver circuit comprising X output drivers to transfer the Y data bits to Y output nodes, and a bus having X lines coupled between the compression circuitry and the output driver circuit. One or more of the Y output drivers are selectively placed in a tri-state mode in response to a tri-state command provided on the X lines not used to communicate the Y data bits.

A method of testing an integrated circuit memory comprises reading X number of outputs of sensing circuitry in the memory so that X data bits are read, comparing the X data bits to a predetermined data pattern, and compressing the X data bits to Y compressed bits, where Y is less than X. The Y compressed bits are communicated to an output driver circuit via Y lines of an internal X bit bus. Y output data bits are then generated using the output driver circuit in response to the Y compressed bits and the comparison, wherein the Y output bits are either a logic one, a logic zero or tri-state.

DETAILED DESCRIPTION OF THE DRAWINGS

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
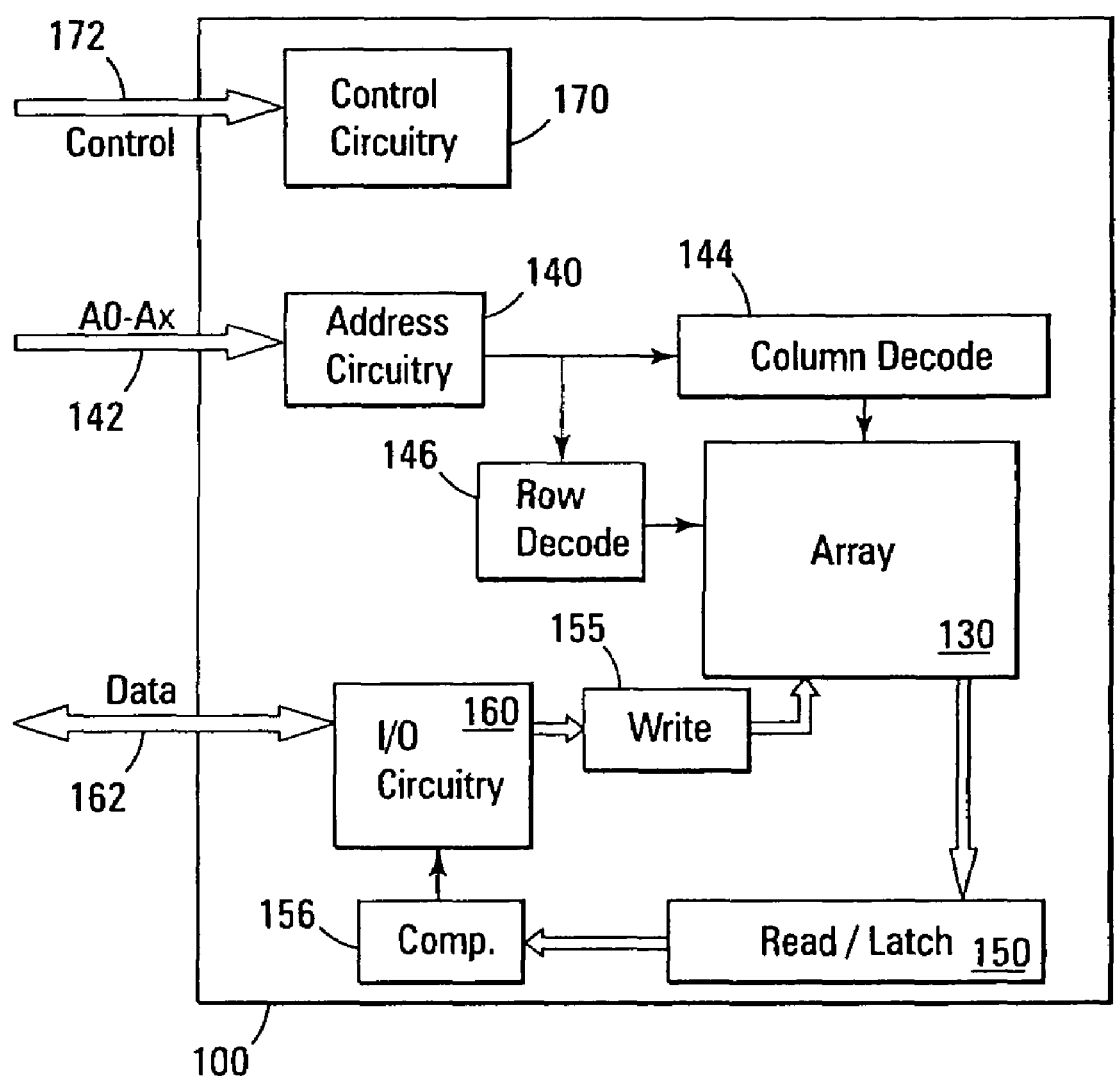
FIG. 1 a block diagram of one embodiment of an integrated circuit of the present invention.

FIG. 1 is a functional block diagram of a memory device 100 of one embodiment of the present invention. The memory device 100 has been simplified to focus on features of the memory that are helpful in understanding the present invention. The memory device includes an array of memory cells 130. The memory cells are non-volatile floating-gate memory cells. The memory array 130 is arranged in banks of rows and columns.

An address buffer circuit 140 is provided to latch address signals provided on address input connections A0-Ax 142. Address signals are received and decoded by row decoder 144 and a column decoder 146 to access the memory array 130. It will be appreciated by those skilled in the art, with the benefit of the present description, that the number of address input connections depend upon the density and architecture of the memory array.

The memory device reads data in the array 130 by sensing voltage or current changes in the memory array columns using sense/latch circuitry 150. The sense/latch circuitry, in one embodiment, is coupled to read and latch a row of data from the memory array. Data input and output buffer circuitry 160 is included for bi-directional data communication over a plurality of data (DQ) connections 162. Write circuitry 155 is provided to write data to the memory array. A selectable compression circuit 156 can be used to compress data read from the memory array blocks prior to coupling the data to the DQ output connections, as explained below.

Command control circuit 170 decodes signals provided on control connections 172. These signals are used to control the operations on the memory array 130, including data read, data write, and erase operations. The flash memory device has been simplified to facilitate a basic understanding of the features of the memory. A more detailed understanding of internal circuitry and functions of flash memories are known to those skilled in the art.

Embodiments of the present invention provide for testing of an integrated circuit, such as a memory device, by compressing the output data to a reduced number of output connections. As explained above, multiple output data signals are compressed to a single data connection. As such, a limited number of data connections are required for each device and multiple devices can be coupled to a tester for simultaneous testing.

U.S. Pat. No. 5,787,097 entitled "Output Data Compression Scheme for Use in Testing IC Memories," issued Jul. 28, 1998, describes circuitry inside memory chips which is enabled during an I/O compression test mode that "compresses" the data which is normally output on 16 data pins down to fewer than 16 data pins. During the I/O compression test mode, active output drivers output a pre-processed data that make it possible for a tester to verify the pass/fail status of specific patterns at different address locations. Thus, when the memory is tested, information which is normally represented on all 16 of the data pins during the normal user mode of operation is represented on fewer than 16 pins during the I/O compression test mode. Using this compressed data, the tester is able to extract enough information to detect failing patterns. As taught in U.S. Pat. No. 5,787,097, four typical test patterns are used to test memory arrays: (1) all "0"; (2) all "1"; (3) checkerboard "0101010101010101"; and (4) inverted checker board "1010101010101010". Although only these four patterns are typically used, it should be well understood that other patterns could be used as well. The test patterns are written to the memory array and then read. The output of the array is then coded and output on a compressed number of output connections.

The above described compression technique compressed a data pattern of all 1's to four's, all 0's to four 0's, a checker board 555H to a 5H, and an inverse checkerboard AAAA H to an A H. Any other data pattern became unknown output patterns because the data was compressed by logically operating on the read data. As such, defects could be identified, but not accurately located for redundant replacement operations.

Unlike prior compression methods, embodiments of the present invention use a three-state output to indicate results of the test. Because the data patterns used to test a memory device are either combinations of logic zero or logic one, the compressed output is either logic zero, logic one or tri-stated. For example, in one embodiment four I/O lines are compressed to one. If all four I/O lines are logic one, the single compressed I/O is also a one. If all four I/O lines are logic zero, the single compressed I/O is also a zero. If any other combination of I/O lines is read, the compressed I/O line is tri-stated. An external tester reading the compressed I/O lines can therefore determine that at least one of the four I/O lines contains a defect.

Figure 2:
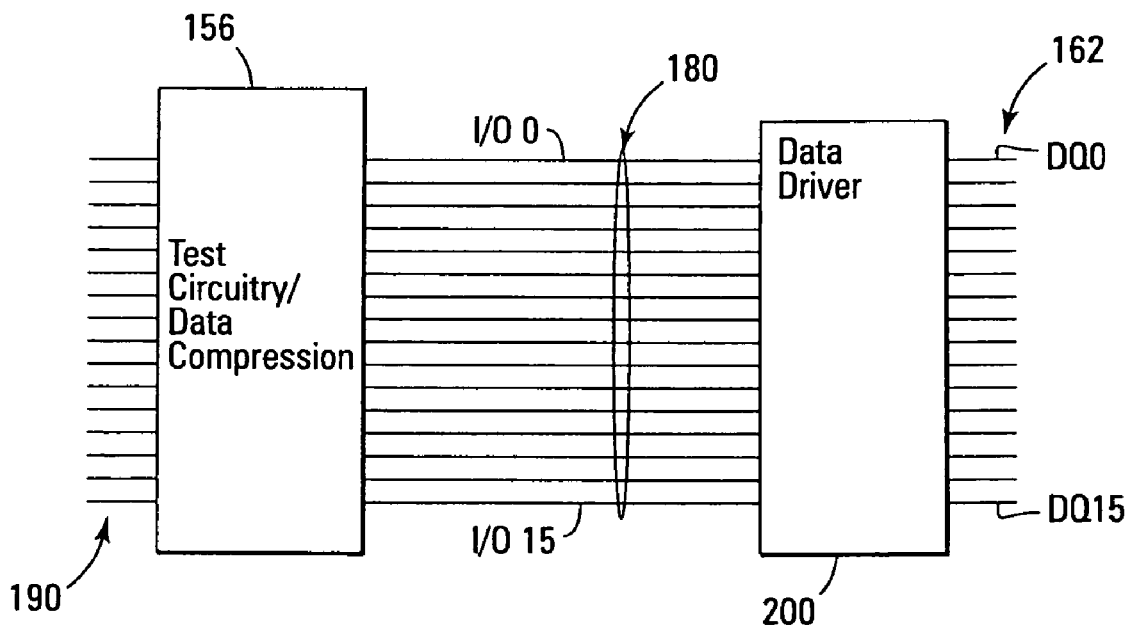
FIG. 2 illustrates I/O connections in the integrated circuit of FIG. 1.

FIG. 2 illustrates an embodiment of a memory device that has 16 I/O internal lines 180 coupled between test circuitry/data compression 156 and output data drivers 200. The test circuitry/data compression receive data read from 16 columns 190 and translates the read data to I/O lines. The data driver circuitry 200 then drives the compressed data to external DQ connections 162. As explained above, groups of four columns are evaluated and compressed to a single I/O line. If the compressed data is either a one or a zero, the driver circuit respectively drives a one or a zero to the DQ connections. To tri-state one or more of the compressed DQ lines, the data driver is instructed to tri-state the driver for a specific DQ connection. In prior memory devices, all DQ connections of the output driver can be placed in a tri-state in response to a command. Individual DQ connections, however, have not been controlled for selective tri-stating during testing to indicate test results.

Figure 3:
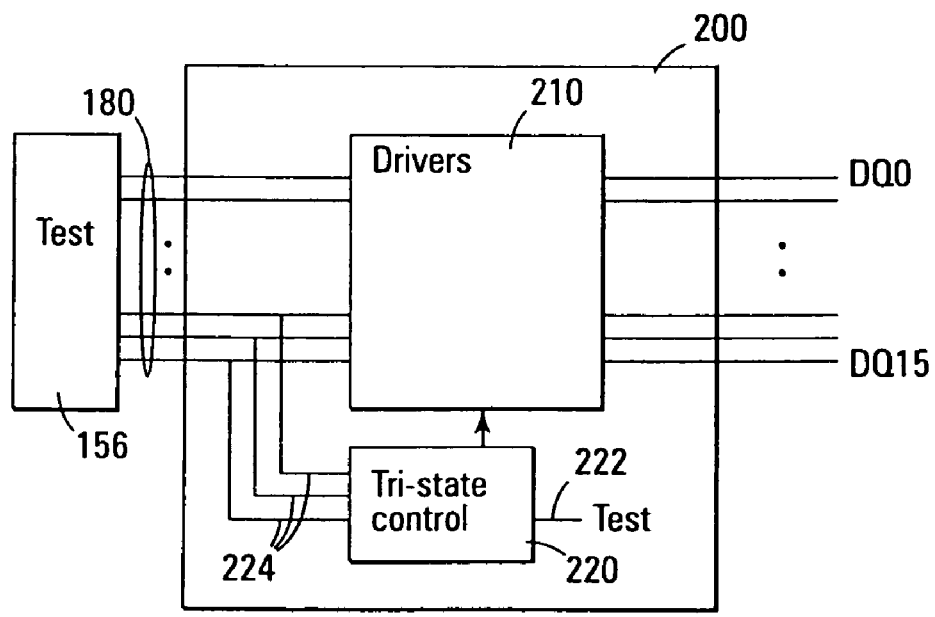
FIG. 3 is a more detailed illustration of data drivers of the integrated circuit of FIG. 1.

Referring to FIG. 3, in one embodiment of the present invention a tri-state control circuit 220 of the data driver circuitry 200 is coupled to some of the I/O lines 224. That is, the test circuitry 156 uses some of the I/O lines to provide command codes to the data driver circuit during a test operation. The command codes, in combination with a test signal 222, instruct which individual DQ driver 210 is to be tri-stated. Using the internal I/O lines during testing for driver control eliminates the need for extra control lines to the driver circuits that could substantially increase fabrication cost and complexity of the integrated circuit design.

A set of four redundant columns can be substituted for the four tested columns that contain a defect identified during testing. As such, the ability to quickly identify a set of defective columns allows for the replacement of the tested columns without additional un-compressed testing. Redundant column replacement methods are well known in the art and are not described in detail herein. The number of output pins in the memory which remain active during the I/O compression test mode are the 1 data connections. This permits four 16-bit memory devices, rather than just a single memory to be simultaneously tested by a single tester having 16 I/O connections. Four data pins were chosen because certain memory chips require at least 1 I/O pins to pass basic write commands, such as for example, program, erase, erase suspend and status read for a flash memory. It should be well understood, however, that the number of active output connections on the memory devices may be reduced to a number greater than or less than 1.

Figure 4:
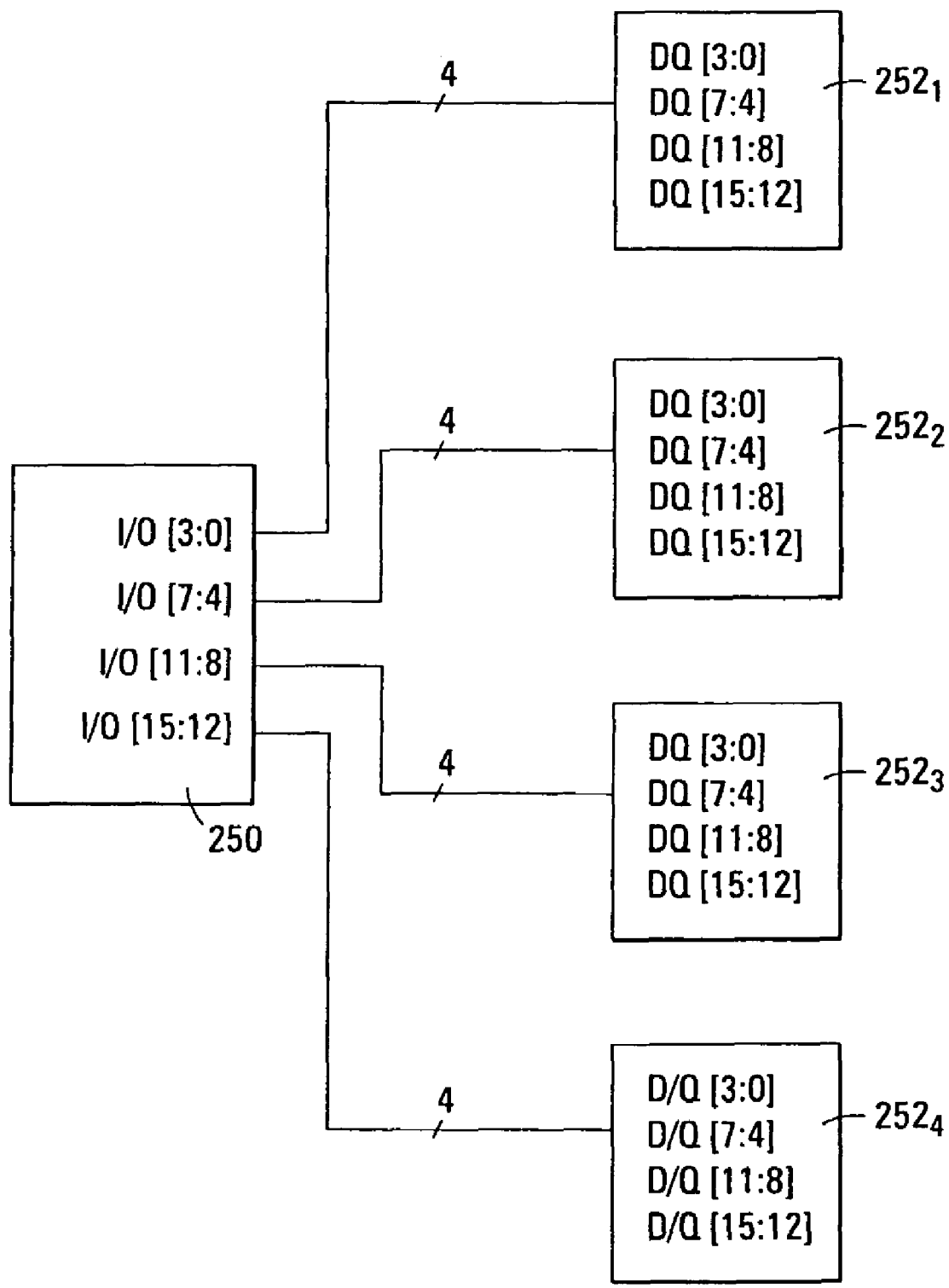
FIG. 4 is a block diagram illustrating a memory tester according to one embodiment of the present invention.

FIG. 4 illustrates an example memory tester of an embodiment of the present invention. Four memory devices $252_{1-4}$ in accordance with the present invention are coupled to a tester 250. In general, in order to maximize the number of parts that can be tested in parallel, i.e., simultaneously, by the tester, each of the memory devices are placed in a special I/O compression test mode in which the number of active output pins on the memory is reduced. As discussed above, circuitry inside each of the memory which is enabled during the I/O compression test mode "compresses" the data which is normally output on all 16 data pins down to fewer than 16 data pins. During the I/O compression test mode, the active output drivers output signals that are either a logic one, a logic zero or tri-state. For example, memory $252_1$, is coupled to use I/O[3:0] to communicate compressed test data while memory $252_2$ is coupled to use I/O[7:4] to communicate compressed test data. Each memory, however, can use the same DQ connections but are connected to different I/O inputs of the tester.

CONCLUSION

A memory device has been described that uses data compression to read data from an array of the memory during testing. The compressed data is either a logic one, logic zero or tri-state, depending upon the data read from the array. Output drivers of the memory are placed in a tri-state condition in response to a detected read error. Non-compressed internal I/O lines are used during testing to provide control signals to the driver circuitry to selectively place drivers in the tri-state mode. Once a tri-state is detected four columns of memory cells can be replaced with four columns of redundant memory cells without requiring additional non-compressed testing.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. A memory device comprising:
   sensing circuitry for reading a plurality of stored data bits during a test mode read cycle;
   read compression circuitry for generating a reduced plurality of compressed data bits from the plurality of stored data bits; and
   an output circuit coupled to the read compression circuitry to drive a plurality of output signals equal to the plurality of compressed data bits, wherein selected output signals are tri-stated in response to a subset of the plurality of compressed data bits.

2. The memory device of claim 1 further comprising a data detection circuit coupled to receive the plurality of stored data bits and detect whether or not the plurality of stored data bits in the test mode read cycle are arranged in a pattern in which all bits are identical.

3. The memory device of claim 2 wherein the data detection circuit is coupled to provide tri-state command signals to the output circuit.

4. The memory device of claim 2 wherein the data detection circuit communicates the tri-state command signals to the output circuit via internal data I/O lines coupled between the data detection circuit and the output circuit.

5. The memory device of claim 1 wherein the plurality of compressed data bits is equal to one fourth the plurality of stored data bits.

6. A memory device comprising:
   a test circuit adapted to detect first and second patterns among a plurality of stored data bits, wherein the first and second patterns are not all logical ones or logical zeros;
   compression circuitry to compress the plurality of stored data bits to a plurality of compressed data bits in response to the test circuit, the plurality of compressed data bits being less than the plurality of stored data bits; and
   a plurality of output drivers corresponding to the plurality of stored data bits, wherein, during a test mode of operation, only a reduced plurality of output drivers transfer the plurality of compressed data bits to a plurality of output nodes, wherein each of the reduced plurality of output drivers is selectively placed in a tri-state mode when the plurality of stored data bits are not in the first or second patterns.

7. The memory device of claim 6 wherein the plurality of compressed data bits is one fourth of the plurality of stored data bits.

8. The memory device of claim 6 wherein the compression circuit is coupled to the plurality of output data drivers with a first plurality of Input/Output lines, wherein the compression circuit provides tri-state command signals to the reduced plurality of output drivers using a subset of the plurality of compressed data bits.

9. A flash memory device having a test mode of operation, the device comprising:
   compression circuitry to compress a plurality of stored data bits read from a plurality of columns of the flash memory into a reduced quantity of compressed data bits;
   an output driver circuit comprising a plurality of output drivers to output the compressed data bits to a plurality of output nodes; and
   a data bus coupled between the compression circuitry and the output driver circuit, wherein each of the plurality of output drivers are individually and selectively placed in a tri-state mode in response to a command provided on a subset of the data bus that is unused by the compressed data bits.

10. The flash memory of claim 9 wherein the compression circuitry includes a test circuit to establish data states of the compressed data bits in response to the plurality of stored data bits.

11. A method for testing an integrated circuit memory comprising:
   reading a plurality of stored data bits from a plurality of outputs of sensing circuitry in the memory; and
   compressing the plurality of stored data bits to generate a plurality of compressed data bits such that the plurality of compressed bits are output as a plurality of output bits that are either a logic one or a logic zero in response to the plurality of compressed data bits or one or more of the plurality of output bits is individually tri-stated in response to a command code.

12. The method of claim 11 wherein the plurality of output bits are logic one when the plurality of stored data bits are all logic one.

13. The method of claim 11 wherein the plurality of output bits are logic zero when the plurality of stored data bits are all logic zero.

14. The method of claim 11 wherein the plurality of output bits are tri-state when the plurality of stored data bits are not all logic one or logic zero.

15. A method for testing an integrated circuit memory comprising:
   reading a plurality of outputs of sensing circuitry in the memory so that a plurality of stored data bits are read;

comparing the plurality of stored data bits to a predetermined data pattern;

compressing the plurality stored data bits to a reduced quantity of a plurality of compressed data bits;

coupling the plurality of compressed data bits to an output driver circuit via a plurality of lines of an internal bus; and generating a plurality of output data bits from the output driver circuit in response to the plurality of compressed data bits and the comparison, wherein each of the plurality of output data bits is selectively tri-stated in response to a command code.

16. The method of claim 15 wherein the command code is communicated to the output driver circuit over a subset of the plurality of internal data bus lines, the command code instructing the output driver circuit to selectively tri-state one or more of the plurality of output data bits.

17. The method of claim 15 wherein the plurality of compressed data bits is equal to one fourth of the plurality of stored data bits.

18. A memory test system comprising:
a memory tester;
a plurality of memory integrated circuits coupled to the memory tester, each of the memory integrated circuits comprising:
sensing circuitry for reading a plurality of stored data bits; and
read compression circuitry for generating for compressing the plurality of stored data bits to a reduced plurality of compressed data bits; and
an output circuit coupled to the read compression circuitry for driving a plurality of output signals, wherein the plurality of output signals are either a logic one or a logic zero in response to the plurality of compressed data bits or the plurality of output bits are selectively tri-stated in response to a command code.

19. The memory test system of claim 18 wherein the memory tester is adapted to determine that an error has occurred when any of the output signals are in the tri-state.

* * * * *